March 31, 1970 F. I. NAGEL 3,504,096

SEMICONDUCTOR DEVICE AND METHOD

Filed Jan. 31, 1968

WITNESSES:

Bernard R. Gieguey

Lee P. Johns

INVENTOR

Fred I. Nagel

BY

C. L. Menzemer

ATTORNEY 3,504,096
Patented Mar. 31, 1970

3,504,096

SEMICONDUCTOR DEVICE AND METHOD

Fred I. Nagel, Baltimore, Md., assignor to Westinghouse Electric Corporation, Pittsburgh, Pa., a corporation of Pennsylvania Filed Jan. 31, 1968, Ser. No. 701,984
Int. Cl. H05k 5/02
U.S. Cl. 174—52 3 Claims

ABSTRACT OF THE DISCLOSURE

A semiconductor device including a semiconductor wafer within a dielectric case, the wafer being bonded on one side to electric leads extending through the case and on the other side to a metal cover, and the cover being bonded to the case.

BACKGROUND OF THE INVENTION

Field of the invention

This invention relates to a semiconductor device and to a method of assembly thereof.

Description of the prior art

A current method of packaging semiconductor devices involves the mounting of a semiconductor wafer by bonding it to the interior of an encapsulating case, then bonding connecting wires to the wafer and to terminal leads within the casing, and then mounting a cover on the casing to enclose the wafer and connecting wires. Such a method is unreliable when subjected to extreme environmental conditions such as heat, shock, and vibration because the connecting wires are unsupported and move from their original positions and into contact with adjacent wires or other portions of the wafer, thereby causing short circuits, or breaking loose and creating open circuits.

Another method of packaging involves the preliminary application of solder or bonding of a gold ball on specified locations of the wafer and then bonding the wafer to matching terminal leads which register with the previously placed solder or gold balls. This method is unsatisfactory because of the poor heat dissipation capabilities resulting from the lack of thermal contact between the wafer and a heat absorbing substrate.

In accordance with this invention it has been found that the foregoing disadvantages may be overcome by first bonding the wafer to a heat-absorbing substrate, applying solder or a bonded gold ball to the wafer on the side opposite the substrate in positions registering with those of terminal leads, and then simultaneously bonding the wafer to the leads and the substrate to the enclosing casing for which the substrate serves as a sealing cover.

Accordingly, it is a general object of this invention to provide a semiconductor device and method having reliability and simplicity of manufacture.

It is another object of this invention to provide a semiconductor device and method which eliminates shorting or open circuit problems and reduces heat dissipation disadvantages of prior semiconductor devices.

Finally, it is an object of this invention to satisfy the foregoing objects and desiderata in a simple and effective manner.

SUMMARY OF THE INVENTION

The semiconductor device of the present invention comprises a dielectric case having a central opening adapted to receive and house a semiconductor wafer, electrical leads extending through the case and into the opening which leads have end portions spaced from each other, a semiconductor wafer disposed within the opening, a bonded joint between one side of said wafer and the end portion of each lead, a cover on the case and secured thereto by a bonded joint hermetically sealing the opening, and the other side of the wafer being bonded to the cover.

BRIEF DESCRIPTION OF THE DRAWINGS

For a better understanding of the nature and objects of this invention, reference is made to the drawings, in which.

Similar numerals refer to similar parts throughout the several views of the drawing.

DESCRIPTION OF THE PREFERRED EMBODIMENT

Figure 1:
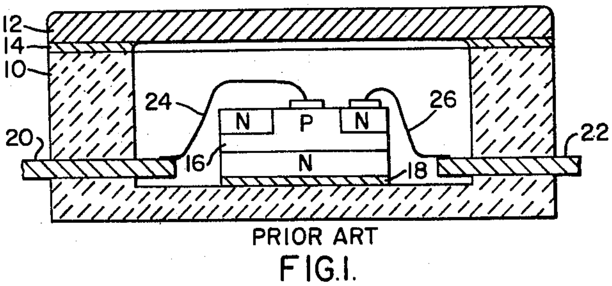
PRIOR ART FIG.1.
FIG. 1 is a sectional view through a semiconductor device of prior art construction.

The prior art construction of FIG. 1 includes a package including a case 10 and a cover 12. The cover 12 is secured to the case 10 by a brazed, soldered or bonded joint 14 whereby a wafer 16 of semiconductor material, having n- and p-type regions, is contained within the case 10 as shown. One side of the wafer 16 is bonded to the bottom surface of the case 10 by brazed or solder joint 18. Electric leads or wires 20 and 22 extend through the case 10 and into the chamber where the end portions of the leads are connected to the wafer 16 by connecting wires 24 and 26 respectively. That is, one end of each connecting wire 24 and 26 is secured such as by thermo compression bonding to the inner end of the corresponding leads 20 and 22 and the other end of each connecting wire is bonded to a specific portion of the surface of the wafer 16 opposite that of the bonded joint 18.

One disadvantage of the prior art construction of FIG. 1 is that the connecting wires 24 and 26, being of a very small gauge were frequently dislodged from their original positions due to environmental conditions such as heat shock and vibration thereby causing short or open circuits and failure of the device. Another disadvantage of the prior art construction is the inferior heat dissipation from the wafer 16 when the case 10 was composed of a material having an inferior coefficient of thermal conductivity.

Figure 2:
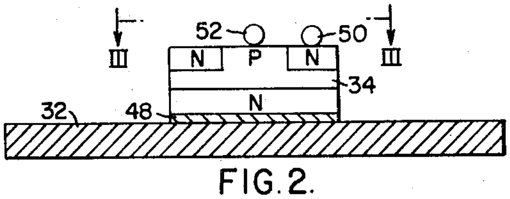
FIG. 2 is a sectional view through a subassembly of a device of the present invention.
Figure 3:
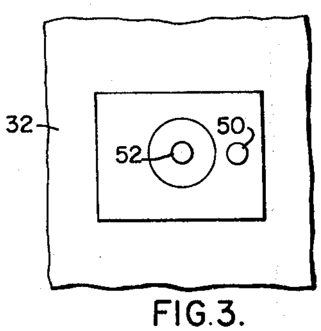
FIG. 3 is a partial plan view taken on the line III—III of FIG. 2.
Figure 4:
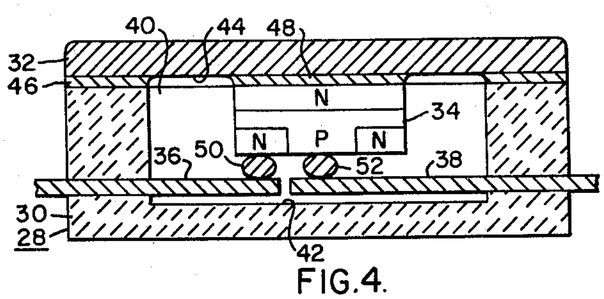
FIG. 4 is a sectional view through a semiconductor device of the present invention.

The semiconductor device or package of the present invention which is adapted to correct the disadvantages of the prior art construction is shown in FIGS. 2–4. In FIG. 4 a semiconductor device or package generally indicated at 28 includes a case 30, a cover 32, a wafer 34 of semiconductor material, and a plurality of, including at least two, electric leads 36 and 38. The case 30 is composed of any suitable material such as glass, ceramic, or metal, preferably alumina ($Al_2O_3$); and is provided with an opening 40 having a bottom wall 42.

It is understood, of course, that where the case 30 is composed of metal, the leads 36 and 38 are fully insulated from the case.

Where the case 30 is composed of an electrical conductive material such as an alloy or metal, the electrical leads 36 and 38 are provided with insulation (not shown) in order to avoid short-circuiting of the current from the leads through the case 30. The cover 32 is composed of a material having a relatively high coefficient of thermal conductivity such as an alloy or metal, as for example a copper and ferrous base alloy of the type sold under the trademark Kovar.

The cover 32 has a bottom surface 44 the outer periphery of which is sealed at 46 such as by soldering, brazing or otherwise to the case 30. For that purpose the seal 46 may be accomplished by the use of a sealing preform such for example as one composed of an alloy of gold and tin.

Likewise, the wafer 34 is joined at 48 such as by soldering, to provide a good path of electrical and thermal conductivity between the wafer and the cover 32. For that purpose the bottom surface 44 may be preliminarily coated with a metal such as gold.

As shown in FIG. 4, the inner end portions of the leads 36 and 38 are secured to specific portions of the wafer 34 by the use of minute bodies 50 and 52 of a suitable solder or brazing material such as gold tin alloy, or gold, whereby a satisfactory electrical contact is obtained between the specific portions of the wafer and the corresponding leads 36 and 38. Moreover, while the inventive structure has been shown with a transistor housed within the case 30 it should be understood that a diode may be employed in place of the transistor. In such structure the cover 32 would be utilized as one electrical contact and one lead would project through the walls of the case 30.

The device 28 is assembled by first mounting the wafer 34 on the cover 32 in the precise location as shown in FIG. 2. For that purpose the surface of the cover may be preliminarily provided with a coating of a metal or eutectic alloy used for brazing or soldering to provide the bonded joint 48. In addition the bodies 50 and 52 are preliminarily mounted or deposited on the top surface of the wafer 34 over the corresponding N and P regions of the wafer. The precise location of the bodies 50 and 52 are determined to match or register with the locations of the end portions of the leads 36 and 38.

The subassembly as shown in FIG. 2 of the wafer 34 and the cover 32 is then finally assembled with the case 30 and the leads 36 and 38. For that purpose the cover wafer subassembly may be either turned over and brought into position over the case 30 or the subassembly of the case 30 and leads 36 and 38 may be inverted and brought into position over the subassembly as shown in FIG. 2. Before the subassemblies are brought into final position a eutectic alloy preform for forming the joint 46 is placed between the case 30 and cover 32.

The subassemblies are then subjected to pressure and heat in an inert gas atmosphere. The pressure varies from about 2000 p.s.i. to about 3000 p.s.i. and the temperature varies upwardly from about 300° C. depending on the solder compositions. The indicated pressures and temperature are maintained until the bonded joints including the seal 46 and the bodies 50 and 52 are melted to form a satisfactory seal between the parts to be joined thereby sealing simultaneously the wafer 34 and the leads 36 and 38 on the one hand and the case 30 and the cover 32 on the other hand. Thereafter the pressure and temperature conditions are removed and the assembly is cooled to room temperature.

The foregoing method is illutrated in the following example:

EXAMPLE

A wafer of semiconductor material is placed in the precise location on a cover on one side of the cover composed of an iron-base alloy containing nickel and cobalt and generally sold under the trademark Kovar. The surface of the cover is plated with gold. The assembly is then heated to a temperature slightly above 400° C. whereby the gold plate and the silicon in the wafer form a eutectic alloy whereby the wafer is bonded to the cover. The assembly is then cooled to room temperature.

Minute balls or bodies of gold are then placed on the upper surface of the wafer on the proper N and P regions or terminal points. The bodies are preliminarily bonded in place by a thermal compression involving the application of 2000 p.s.i. pressure at about 300° C.

A preform of a eutectic composition of gold and tin is then placed on the upper surface rim of an alumina case. The subassembly of the cover and wafer are then inverted and brought into position over the subassembly of the case having terminal leads extending into the opening thereof, and the gold tin eutectic preform. The bodies of gold on the N and P regions of the wafer are brought into alignment or registry with the corresponding leads in the case. The assembly is then subjected to a compressive force of about 2000 lbs. per square inch and at a temperature of 320° C. in a nitrogen atmosphere to assure absence of air and oxygen. The bonding temperature of 320° C. is sufficient to melt the sealing preform between the case and cover as well as bond the minute bodies of gold in order to connect the leads to the appropriate N and P regions of the wafer. The compressive force is then removed and the assembly is gradually cooled to room temperature.

Accordingly the device and method of the present invention satisfies the problems of prior art constructions and provides a reliable packaged semiconductor device which is relatively simple to manufacture. Moreover the device satisfies the prior art problem of heat dissipation.

What is claimed is:

1. A semiconductor device comprising a dielectric case having an opening, electric leads extending through the case and into the opening and having end portions spaced from each other, a semiconductor wafer within the opening, a bonded joint between the wafer and the end portion of each electric leads, a metal cover on the case, a bonded joint hermetically sealing the cover on the case, and the wafer being in surface-to-surface contact with and bonded to the cover, whereby the metal cover serves as a heat-absorbing substrate for internally generated heat during operation of the device.

2. The device of claim 1 in which the leads are bonded on one side of the wafer and the other side of the wafer is bonded to the cover.

3. The device of claim 1 in which the case is composed of alumina, the cover is composed of an iron-base alloy containing nickel and cobalt, the bonded joints between the cover and the base, and the cover and the wafer are composed of a gold-base alloy, and the bonded joint between the wafer and the electric leads is composed of gold.

References Cited

UNITED STATES PATENTS

| | | | |
|---|---|---|---|
| 3,292,241 | 12/1966 | Carroll. | |
| 3,340,348 | 9/1967 | Clark et al. | |
| 3,381,372 | 5/1968 | Capano | 29—627 |
| 3,423,638 | 1/1969 | Dix et al. | |

DARRELL L. CLAY, Primary Examiner

U.S. Cl. X.R.

29—588, 627; 317—100, 101, 234